United States Patent
Yang

(10) Patent No.: US 7,109,120 B2
(45) Date of Patent: Sep. 19, 2006

(54) PROFILED STANDOFF STRUCTURE AND METHOD FOR OPTICAL DISPLAY PACKAGE

(75) Inventor: Xiao Yang, Cupertino, CA (US)

(73) Assignee: Miradia Inc., Sunnyvale, CA (US)

( * ) Notice: Subject to any disclaimer, the term of this patent is extended or adjusted under 35 U.S.C. 154(b) by 0 days.

(21) Appl. No.: 11/043,372

(22) Filed: Jan. 24, 2005

(65) Prior Publication Data

US 2006/0166504 A1 Jul. 27, 2006

(51) Int. Cl.
*H01L 21/311* (2006.01)
*H01L 21/76* (2006.01)

(52) U.S. Cl. .................. 438/701; 438/444; 438/700

(58) Field of Classification Search ............. 257/521; 438/684, 411

See application file for complete search history.

(56) References Cited

U.S. PATENT DOCUMENTS

| | | | |
|---|---|---|---|
| 6,143,190 A * | 11/2000 | Yagi et al. | 216/27 |
| 6,822,326 B1 | 11/2004 | Enquist et al. | |
| 2004/0058476 A1 * | 3/2004 | Enquist et al. | 438/114 |

* cited by examiner

Primary Examiner—Ha Nguyen
Assistant Examiner—Cheung Lee
(74) Attorney, Agent, or Firm—Townsend and Townsend and Crew LLP

(57) ABSTRACT

A method for forming a standoff structure for devices, e.g., optical devices, integrated circuit devices, micro-electrical mechanical systems (i.e., MEMS). The method includes providing a substrate (e.g., silicon wafer), which has a first surface region characterized by a <100> crystal orientation, a second surface region, and a thickness defined between the first surface region and the second surface region. The method includes protecting selected portions of the first surface region using a masking layer while leaving a plurality of unprotected regions. Each of the unprotected regions is to be associated with an opening through the thickness of the substrate. The method includes immersing the substrate into an etching solution. The method also includes causing removal of the plurality of unprotected regions to form a plurality of openings through the entirety of the thickness of the substrate using the etching solution. The method includes forming an angled surface region from the first surface region to the second surface region and subjecting the angled surface region to the etching solution to form a substantially vertical sidewall region to provide a resulting patterned substrate. Each of the openings is bordered by a portion of the selected portions of the first surface region. The method includes removing the masking layer.

10 Claims, 14 Drawing Sheets

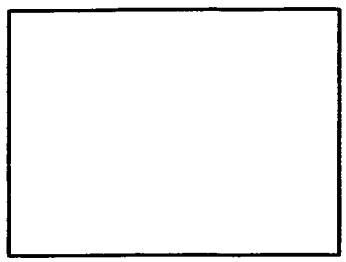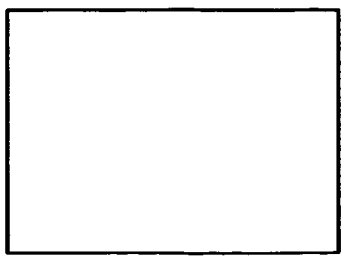
FIG. 6

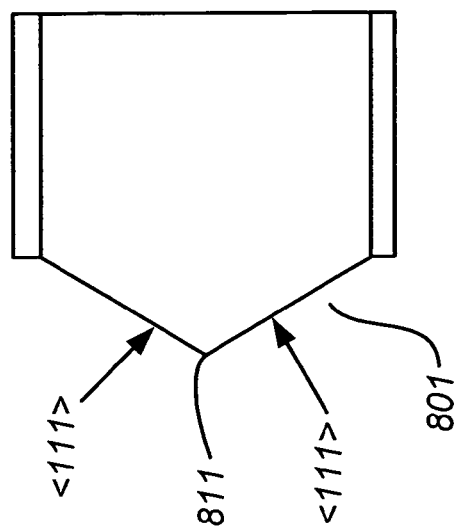
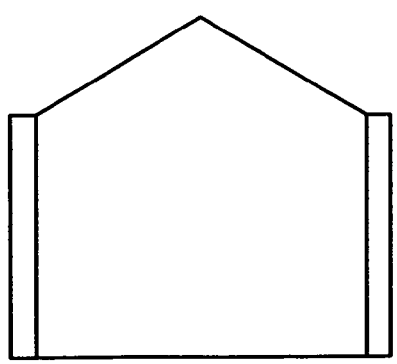
FIG. 8

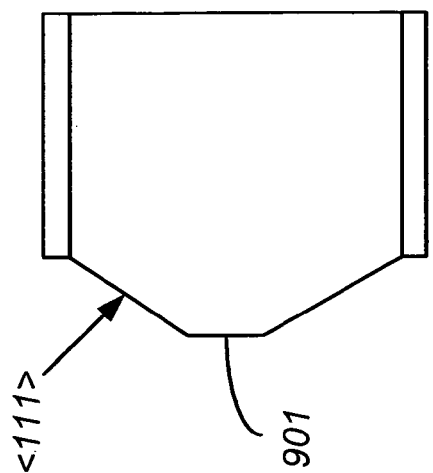
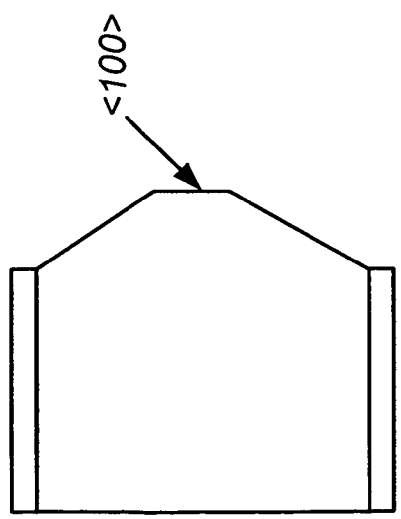
FIG. 9

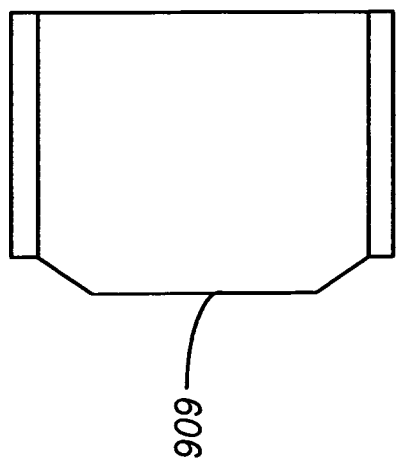
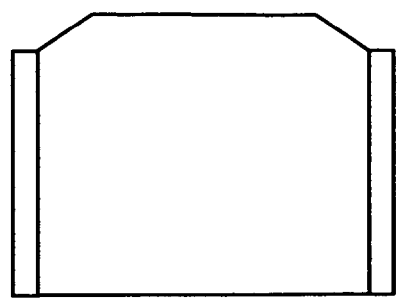
FIG. 10

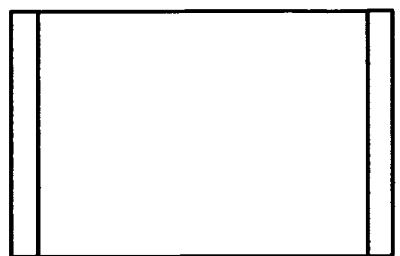
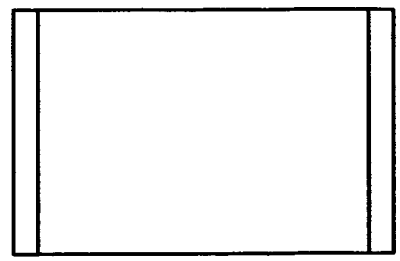
FIG. 11

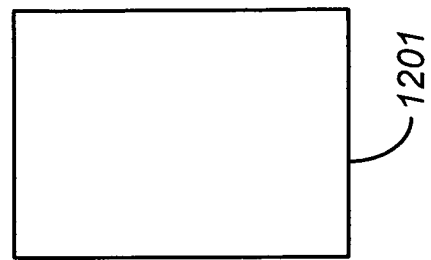
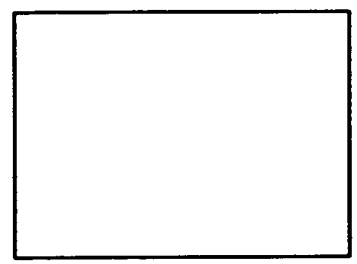
FIG. 12

PROFILED STANDOFF STRUCTURE AND METHOD FOR OPTICAL DISPLAY PACKAGE

BACKGROUND OF THE INVENTION

The present invention relates generally to processing structures for packaging techniques. More particularly, the invention includes a method and structure for processing standoff structures using a batch process for optical display device packages. Merely by way of example, the invention has been applied to integrating a mechanical based structure with an integrated circuit chip for optical display chips. But it would be recognized that the invention has a much broader range of applicability.

Visual display technologies have rapidly developed over the years. Most particularly, electronic displays for outputting television shows, streaming video, and the like. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. DLP is also manufactured using MEMS based processing techniques. Such MEMS based processing technique is often costly and difficult to scale up for efficient processing. More specifically, packaging techniques used for MEMS are also difficult and costly to scale up.

From the above, it is seen that an improved technique for packaging devices is desired.

BRIEF SUMMARY OF THE INVENTION

According to the present invention, techniques for processing structures for packaging techniques are provided. More particularly, the invention includes a method and structure for processing standoff structures using a batch process for optical display device packages. Merely by way of example, the invention has been applied to integrating a mechanical based structure with an integrated circuit chip for optical display chips. But it would be recognized that the invention has a much broader range of applicability.

In a specific embodiment, the present invention provides a method for forming patterned silicon materials, e.g., silicon wafer materials. The method includes providing a silicon substrate (e.g., silicon wafer) having a first surface region characterized by a <100> crystal orientation plane and a second surface region characterized by a <100> crystal orientation plane, a thickness of material defined between the first surface region and the second surface region. The method includes protecting first selected regions on the first surface region using a first masking layer and protecting second selected regions using a second masking layer, which is facing the first selected regions, on the second surface region. In a specific embodiment, the present method includes immersing the silicon substrate into an etching solution, e.g., potassium hydroxide, TMAH. The method removes first unprotected regions on the first surface and removes second unprotected regions on the second surface to cause removal of a portion the thickness of material in the first unprotected regions and the second unprotected regions using the etching solution to form a plurality of openings formed in the first unprotected regions and the second unprotected regions through an entirety of the thickness of material. The method includes forming a first angled surface region and a second angled surface region within each of the plurality of openings. Preferably, the first angled surface region is characterized by a <111> crystal orientation plane and the second angled surface region is characterized by a <111> crystal orientation plane. The method includes forming an intersection of the first angled surface region, the second angled surface region, and a portion of the silicon substrate in the <100> crystal orientation plane. In a preferred embodiment, the intersection forms a line region. The method includes subjecting the angled surface region to the etching solution to cause removal of the portion of silicon substrate in the <100> crystal orientation plane to increase a surface region of the portion of the silicon substrate in the <100> crystal orientation plane within each of the plurality of openings. The method includes forming a substantially vertical portion of the silicon substrate within each of the plurality of openings formed in the thickness of material to form a patterned silicon substrate. The method removes the first masking layer and removes the second masking layer. Next, the method bonds the patterned silicon substrate to a handle substrate.

In yet an alternative specific embodiment, the present invention provides a method for forming a standoff structure for devices, e.g., optical devices, integrated circuit devices, micro-electrical mechanical systems (i.e., MEMS). The method includes providing a substrate (e.g., silicon wafer), which has a first surface region characterized by a <100> crystal orientation, a second surface region, and a thickness defined between the first surface region and the second surface region. The method includes protecting selected portions of the first surface region using a masking layer while leaving a plurality of unprotected regions. Each of the unprotected regions is to be associated with an opening through the thickness of the substrate. The method includes immersing the substrate into an etching solution. The method also includes causing removal of the plurality of unprotected regions to form a plurality of openings through the entirety of the thickness of the substrate using the etching solution. The method includes forming an angled surface region from the first surface region to the second surface region and subjecting the angled surface region to the etching solution to form a substantially vertical sidewall region to provide a resulting patterned substrate. Each of the openings is bordered by a portion of the selected portions of the first surface region. The method includes removing the masking layer.

Many benefits are achieved by way of the present invention over conventional techniques. For example, the present technique provides an easy to use process that relies upon conventional technology. In some embodiments, the method provides higher device yields for the bonded substrates. Additionally, the method provides a process that is compatible with conventional process technology without substantial modifications to conventional equipment and processes. Preferably, the invention provides for an improved integrated structure including integrated circuits and mirror structures for display applications. In preferred embodiments, the present method provides a batch process, which can produce high throughput and yields. In a preferred embodiment, the method uses common or readily available high volume <100> silicon wafers that are used for most conventional integrated circuits without a need to use <110> or other type of wafers. Straight walls can save valuable silicon space/real estate, increase die account, lower die cost according to certain embodiments. This wafer process does not require complicated corner compensation schemes to achieve well defined sidewall profile according to certain embodiments. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 1 through 6 are simplified cross-sectional view diagrams illustrating methods for forming a standoff structure for packaging an optical device according to embodiments of the present invention.

FIGS. 7 through 13 are simplified cross-sectional view diagrams illustrating alternative methods for forming a standoff structure for packaging an optical device according to embodiments of the present invention.

DETAILED DESCRIPTION OF THE INVENTION

Figure 1:
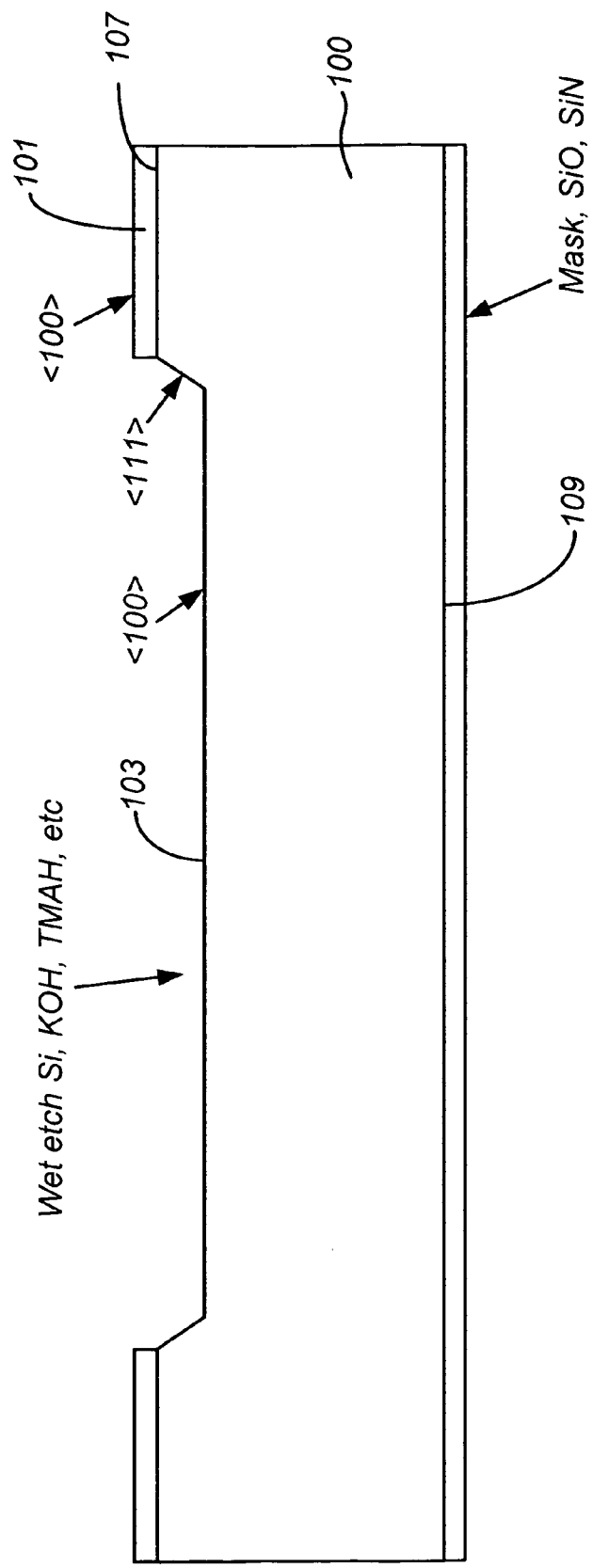

According to the present invention, techniques for processing structures for packaging techniques are provided. More particularly, the invention includes a method and structure for processing standoff structures using a batch process for optical display device packages. Merely by way of example, the invention has been applied to integrating a mechanical based structure with an integrated circuit chip for optical display chips. But it would be recognized that the invention has a much broader range of applicability.

A method for packaging optical devices according to an alternative embodiment of the present invention may be outlined as follows:

1. Provide a substrate (e.g., silicon wafer), which has a first surface region characterized by a <100> crystal orientation, a second surface region, and a thickness defined between the first surface region and the second surface region;

2. Protect selected portions of the first surface region using a masking layer while leaving a plurality of unprotected regions;

3. Immerse the substrate into an etching solution;

4. Cause removal of the plurality of unprotected regions;

5. Form a plurality of openings through the entirety of the thickness of the substrate using the etching solution;

6. Forming an angled surface region from the first surface region to the second surface region;

7. Subject the angled surface region to the etching solution to form a substantially vertical sidewall region to provide a resulting patterned substrate, where each of the openings is bordered by a portion of the selected portions of the first surface region;

8. Remove the masking layer to form a patterned silicon substrate;

9. Provide the patterned silicon substrate;

10. Bond the patterned silicon substrate to a handle substrate to form a plurality of recessed regions defined respectively by the plurality of openings;

11. Bond a second face of the second surface region of the patterned silicon substrate to a device substrate; and 12. Perform other steps, as desired.

The above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 6 are simplified cross-sectional view diagrams illustrating methods for forming standoff structures for use in packaging an optical device according to embodiments of the present invention. These diagrams are merely examples, which should not unduly limit the scope of the claims herein. One of ordinary skill in the art would recognize many variations, alternatives, and modifications. As shown, the present invention provides a method for forming a standoff structure for packaging devices, e.g., optical devices, integrated circuits, MEMS. The method includes providing a substrate 100, e.g., silicon wafer, silicon-on-insulator. The substrate including a first surface region 107, a second surface region 109, and a thickness defined between the first surface region and the second surface region. The method includes protecting 101 selected portions of the first surface region using a masking layer while leaving a plurality of unprotected regions. Preferably, the masking layer is a hard mask made of silicon dioxide, silicon nitride, or a combination of these, among other materials. Preferably, each of the unprotected regions to be associated with an opening through the thickness of the substrate. The method also includes protecting the second surface region 109 using yet another masking layer to cover an entirety of the second surface region. The method includes causing removal of the plurality of unprotected regions 103. According to a specific embodiment, wet etching techniques can be used to form an etched region or recessed region.

Figure 2:
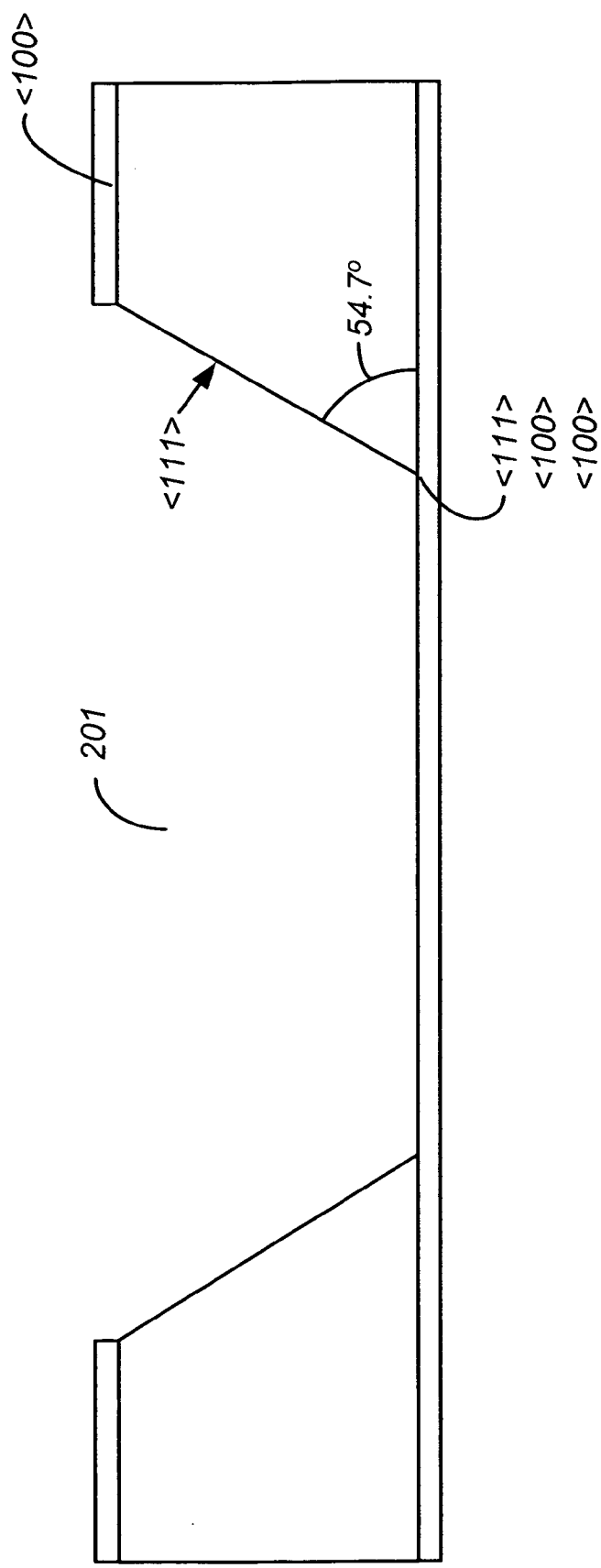

Referring to FIG. 2, the etched region forms a pattern within a <100> crystal orientation of silicon and along a <111> crystal orientation, which defines a periphery of the etched region. As also shown in FIG. 2, the etched region is provided at an angle 54.7 Degrees between the second surface region and a portion of the etched region, which forms the periphery of the recessed region. The etched regions is provided through an entirety of the thickness of the silicon material to the masking layer on the second surface region. An intersection of the second surface region and the periphery of the etched region forms an intersection of certain crystal orientation planes including <111> and <100>.

Figure 3:
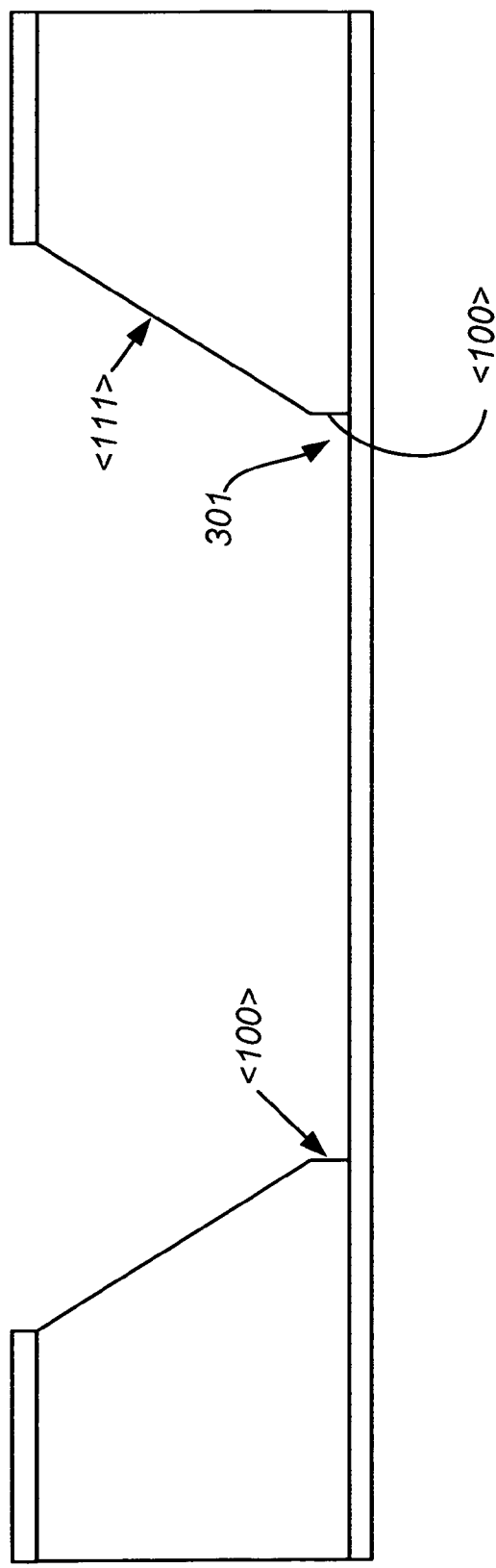

Referring to FIG. 3, the method continues with the etching, which occurs at the intersection that has a crystal orientation plane of <100>, which is etchable using a wet etchant. As the <100> face becomes exposed, it is removed via the wet etching solution. In a specific embodiment, the etching solution is potassium hydroxide having a concentration ranging from about 10% to about 30%. The temperature may also be 60 to 90 degrees Celsius. Alternatively, the etching solution is tetramethylammonium hydroxide (TMAH), which has a concentration ranging from about 10% to about 30%. In a preferred embodiment, the masked structure is completely immersed in an etching solution using a batch process, where multiple substrates can be processed simultaneously. Of course, there can be other variations, alternatives, and modifications.

Figure 4:
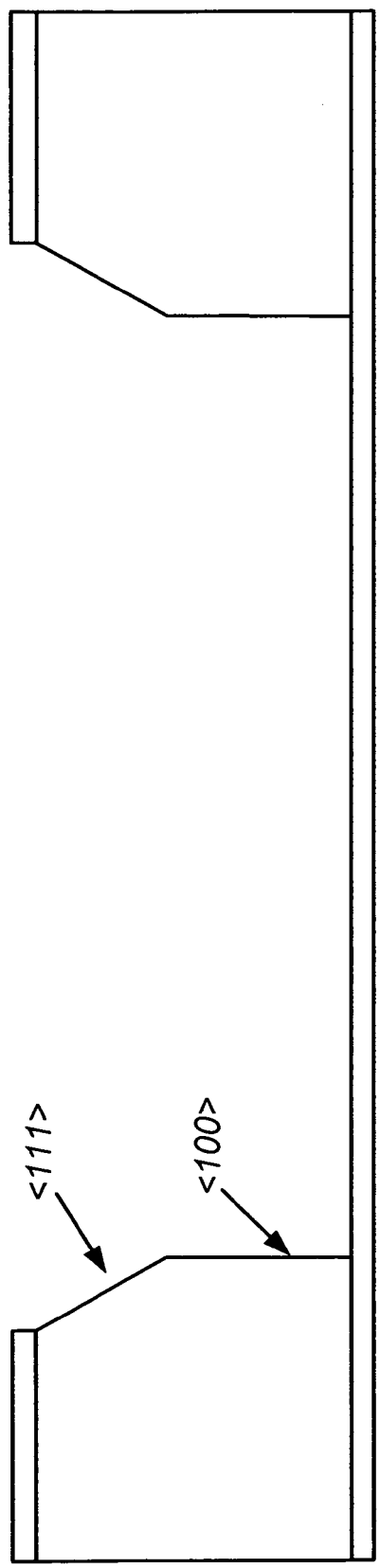
Figure 5:
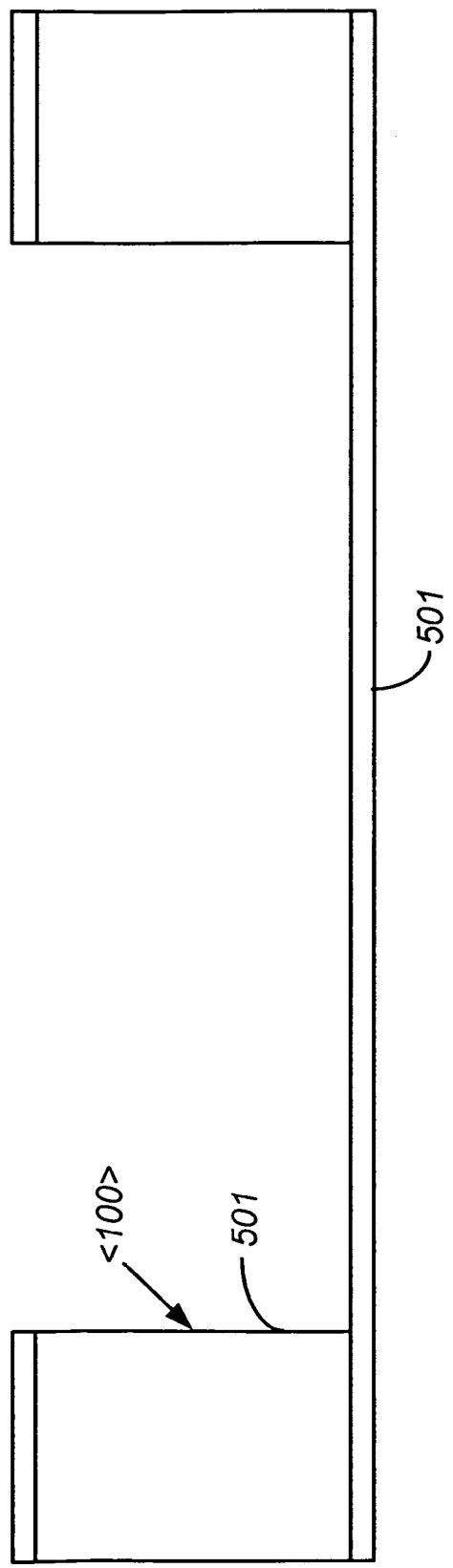
Figure 7:
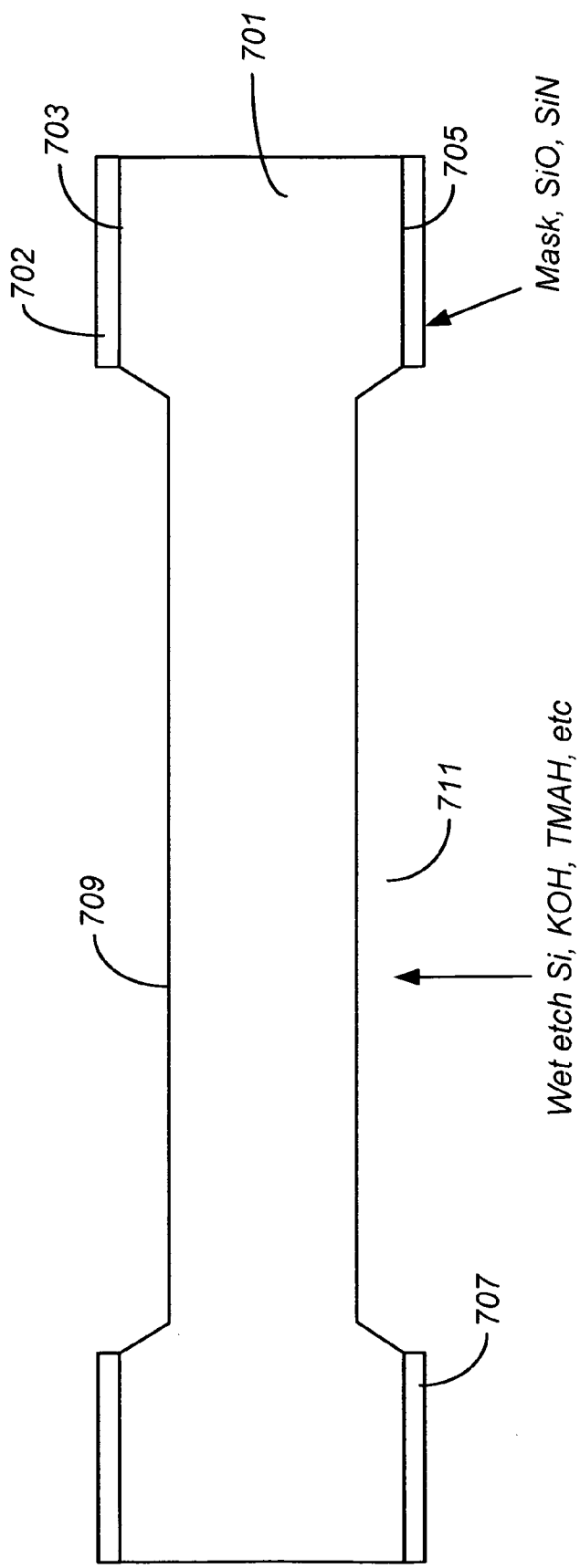

Referring to FIGS. 4 through 6, the method continues to etch to further expose the <100> crystal orientation structure to form a substantially vertical structure as compared to the faces of the substrate. The method continues to remove the surface of the <100> structure until any remaining portion of the <111> structure, which is generally not etchable, has been removed via alternative <100> face. The method stops the etching process at the protective layer, which is often the hard mask 501, as illustrated by FIG. 5.

Next, the method removes the masking layer, as illustrated by FIG. 6. Preferably, stripping or ashing occurs to remove the masking layer. As merely an example, a top-view illustration of the patterned substrate is provided in FIG. 14, although other illustrations can exist. The method also bonds a handle substrate to the patterned substrate. Preferably, the handle substrate is transparent. Each of the openings is bordered by a portion of the handle substrate to form a recessed region. Further details of the process will be described throughout the present specification and more particularly below.

As noted, the above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

A method for packaging optical devices according to an embodiment of the present invention may be outlined as follows:

1. Provide a silicon substrate (e.g., silicon wafer) having a first surface region characterized by a <100> crystal orientation plane and a second surface region characterized by a <100> crystal orientation plane, a thickness of material defined between the first surface region and the second surface region;
2. Protect first selected regions on the first surface region using a first masking layer;
3. Protect second selected regions using a second masking layer, which is facing the first selected regions, on the second surface region;
4. Immerse the silicon substrate (including the masking layers) into an etching solution, e.g., potassium hydroxide, TMAH;
5. Remove first unprotected regions on the first surface;
6. Remove second unprotected regions on the second surface;
7. Cause removal of a portion the thickness of material in the first unprotected regions and the second unprotected regions using the etching solution;
8. Form a plurality of openings formed in the first unprotected regions and the second unprotected regions through an entirety of the thickness of material;
9. Form a first angled surface region and a second angled surface region within each of the plurality of openings, where the first angled surface region is characterized by a <111> crystal orientation plane and the second angled surface region is characterized by a <111> crystal orientation plane;
10. Form an intersection of the first angled surface region, the second angled surface region, and a portion of the silicon substrate in the <100> crystal orientation plane;
11. Subject the angled surface region to the etching solution to cause removal of the portion of silicon substrate in the <100> crystal orientation plane to increase a surface region of the portion of the silicon substrate in the <100> crystal orientation plane within each of the plurality of openings;
12. Form a substantially vertical portion of the silicon substrate within each of the plurality of openings formed in the thickness of material to form a patterned silicon substrate;
13. Remove the first masking layer;
14. Remove the second masking layer;
15. Plasma activate surfaces of patterned substrate and/or handle substrate (optional);
16. Bond the patterned silicon substrate to a handle substrate;
17. Perform bond treatment; and
18. Perform other steps, as desired.

The above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 7 through 13 are simplified cross-sectional view diagrams illustrating methods for packaging an optical device according to embodiments of the present invention. These diagrams are merely examples, which should not unduly limit the scope of the claims herein. One of ordinary skill in the art would recognize many variations, alternatives, and modifications. Like reference numerals are used in these diagrams as the prior diagrams but are not intended to be limiting the scope of the invention claimed herein. As shown, the invention provides a method for forming patterned silicon materials for use in packaging optical device or other like devices, e.g., integrated circuits, MEMS. The method includes providing a silicon substrate 701 having a first surface region 703, a second surface region 705, and a thickness of material defined between the first surface region and the second surface region. Preferably, the substrate is a silicon wafer, silicon on insulator wafer, or other types of wafers or substrates. The method includes protecting 702 first selected regions on the first surface region using a first masking layer. Preferably, the first masking layer is made of a hard mask material such as silicon dioxide, silicon nitride, other like materials, and any combination of these. The method also includes protecting second selected regions 707 on the second surface region using a second masking layer. Preferably, the second selected regions face the first selected regions. Exposed regions 709, 711 are also included. Preferably, the second masking layer is made of a hard mask material such as silicon dioxide, silicon nitride, other like materials, and any combination of these.

Referring now to FIG. 8, the method removes first unprotected regions on the first surface and removes second unprotected regions on the second surface to form exposed regions 801. Here, removal occurs on a portion the thickness of material in the first unprotected regions and the second unprotected regions while maintaining protected regions, which are underlying the masking layer. Preferably, removal of the first unprotected regions and the removal of the second unprotected regions are performed simultaneously using an etching process. In a preferred embodiment, the removal of the first unprotected regions and the removing the second unprotected regions are provided using a wet etching process. The wet etching process can use a suitable chemistry such as KOH, TMAH, EDP (Ethylenediamine Pyrocatecol and water), and other anisotropic etching solutions of silicon bearing materials. As shown, the <111> regions remain unetched, while the etching process forms an intersection of such regions to expose a crystal orientation of <110> plane. In a preferred embodiment, the masked structure is completely immersed in an etching solution using a batch process, where multiple substrates can be processed simultaneously. Of course, one of ordinary skill in the art would recognize many variations, modifications, and alternatives.

Referring to FIGS. 9 through 11, the method continues to etch to further expose the <100> crystal orientation structure 911 to form a substantially vertical structure as compared to the faces of the substrate. The method continues to remove 909 the surface of the <100> structure until any remaining portion of the <111> structure, which is generally not etchable, has been removed via alternative <100> face. The method stops the etching process once the two etched regions meet together and form substantially vertical walls 1101, as illustrated by FIG. 11.

Next, the method removes the masking layer, as illustrated by FIG. 12. Preferably, stripping or ashing occurs to remove the masking layer. As merely an example, a top-view illustration of the patterned substrate is provided in FIG. 14, although other illustrations can exist. The method also bonds a handle substrate to the patterned substrate. Preferably, the handle substrate is transparent. Each of the openings is bordered by a portion of the handle substrate to form a recessed region. Further details of the process will be described throughout the present specification and more particularly below.

Figure 13:
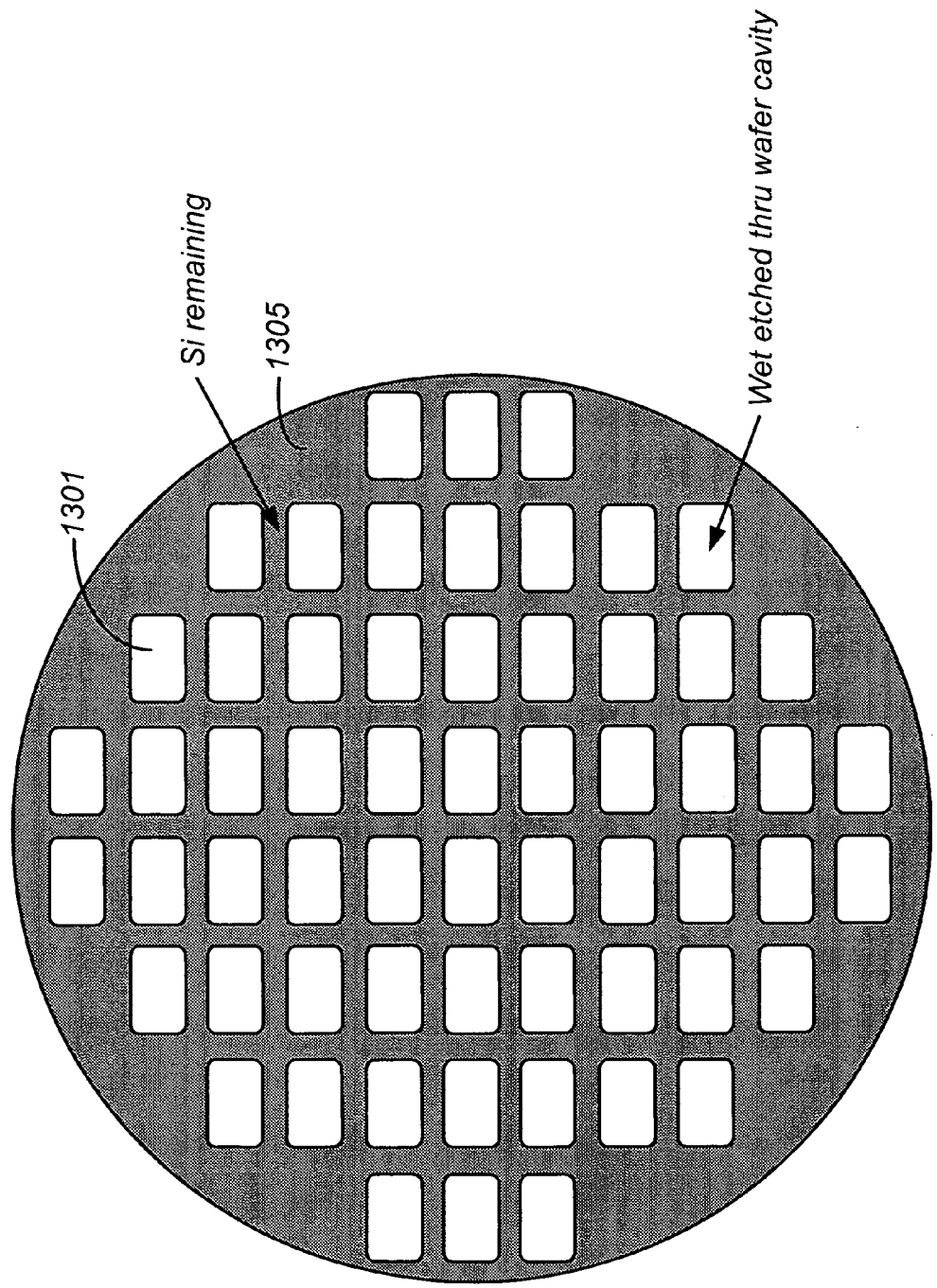

Referring to FIG. 13, the method forms a plurality of openings 1301 in the first unprotected regions and the second unprotected regions. As shown, the openings connected the first and second regions to each other through the thickness of silicon material. The method maintains silicon material 1305 in protected regions. Such silicon material will serve as the standoff regions. The method removes the first masking layer and removes the second masking layer to form a patterned silicon substrate. A top-view illustration of the patterned silicon material is provided by way of FIG. 13. As shown, the patterned silicon material includes standoff region 1305 and a plurality of openings 1301. Depending upon the embodiment, the top-view illustration for the above and other embodiments may look similar or the same depending upon the embodiment.

Figure 14:
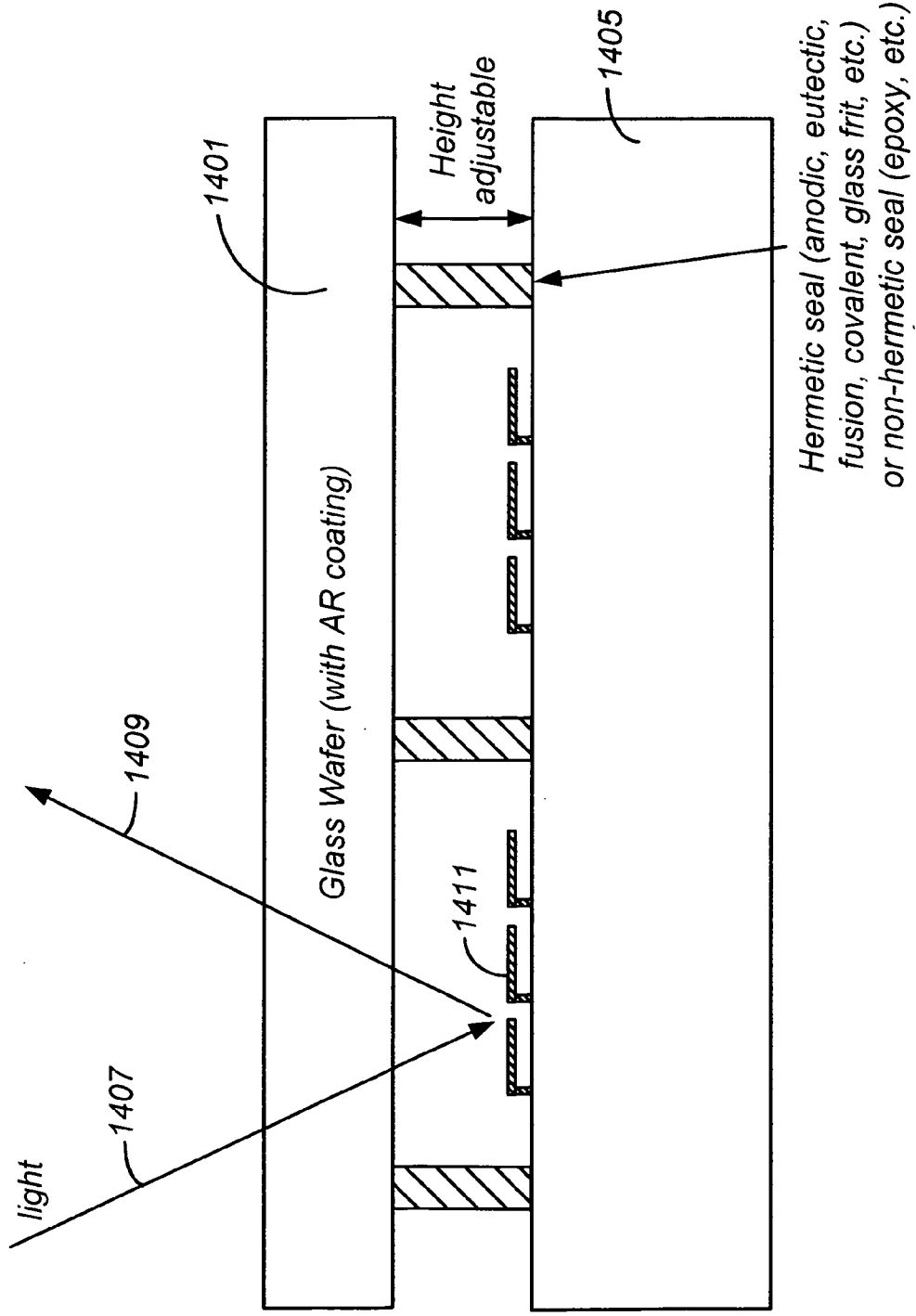
FIG. 14 is a simplified cross-sectional view diagram illustrating an optical display device according to an embodiment of the present invention.

The method initiates a bond between a first face of the first surface region of the patterned silicon substrate to a handle substrate 1401, as illustrated by FIG. 14. As shown, a face of the handle substrate is positioned facing the patterned silicon substrate. Preferably, the handle substrate is a glass substrate and optically transparent. Preferably, the handle substrate includes an overlying antireflective coating overlying surface region. The antireflective coating can be a suitable material such as single layer MgF2 and multilayer stack. Of course, one of ordinary skill in the art would recognize many variations, modifications, and alternatives.

Optionally, each of the faces being bonded to each other is subjected to a pre-bond treatment. The pre-bond treatment can include a cleaning and/or activation process of surfaces to be bonded to each other. The cleaning process can include conventional cleans such as those commonly called "RCA" clean, among plasma activated cleaning and/or treatment processes. Bonding occurs via hermetic bonding techniques or non-hermetic bonding techniques or combinations of these, depending upon the specific embodiment. The hermetic techniques include, among others, anodic, eutectic, fusion, covalent, glass frit, etc. The non-hermetic techniques including, among others, epoxy, glue layers, Liquid Crystal Polymer (LCP), and Benzocyclobutene (BCB). Of course, one of ordinary skill in the art would recognize many other variations, modifications, and alternatives.

As also shown, each of the recessed regions faces at least one chip to enclose the chip with a portion of the patterned silicon substrate. Preferably, the device substrate comprises a plurality of micro-mirror structures or other like structures. Each of the micro-mirror structures is aligned to each of the regions previously occupied by a recessed region, as also shown. Light 1407 traverses through the handle substrate, which has antireflective coatings, reflects off of optical deflection device 1411, and traverses back 1409 through a portion of the handle substrate. Bonding the standoff structures to the device substrate can be achieved through hermetic sealing techniques. Such techniques include, among others, anodic, eutectic, fusion, covalent, glass frit, etc. Other techniques such as non-hermetic seals can also be used. Such non-hermetic seals use epoxy, glue layers, or LCP, BCB, among others. Of course, one of ordinary skill in the art would recognize many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming patterned silicon materials, the method comprising:

providing a silicon substrate having a first surface region characterized by a <100> crystal orientation plane and a second surface region characterized by a <100> crystal orientation plane, a thickness of material defined between the first surface region and the second surface region;

protecting first selected regions on the first surface region using a first masking layer;

protecting second selected regions using a second masking layer, facing the first selected regions, on the second surface region;

immersing the silicon substrate into an etching solution;

removing first unprotected regions on the first surface and removing second unprotected regions on the second surface to cause removal of a portion the thickness of material in the first unprotected regions and the second unprotected regions using the etching solution to form a plurality of openings formed in the first unprotected regions and the second unprotected regions through an entirety of the thickness of material;

forming a first angled surface region and a second angled surface region within each of the plurality of openings, the first angled surface region being characterized by a <111> crystal orientation plane and the second angled surface region being characterized by a <111> crystal orientation plane;

forming an intersection of the first angled surface region, the second angled surface region, and a portion of the silicon substrate in the <100> crystal orientation plane;

subjecting the angled surface region to the etching solution to cause removal of the portion of silicon substrate in the <100> crystal orientation plane to increase a surface region of the portion of the silicon substrate in the <100> crystal orientation plane within each of the plurality of openings; and forming a substantially vertical portion of the silicon substrate within each of the plurality of openings formed in the thickness of material to form a patterned silicon substrate;

removing the first masking layer;

removing the second masking layer; and bonding the patterned silicon substrate to a handle substrate.

2. The method of claim 1 wherein the removing the first unprotected regions and the removing the second unprotected regions are performed simultaneously.

3. The method of claim 2 wherein the etching solution provides an anisotropic etch.

4. The method of claim 1 wherein the handle substrate is a glass substrate.

5. The method of claim 4 further comprising bonding the patterned silicon substrate with the glass substrate to a device substrate.

6. The method of claim 5 wherein the device substrate comprises a plurality of micro-mirror devices.

7. The method of claim 1 wherein the first masking layer and the second masking layer comprise a nitride bearing material.

8. The method of claim 1 wherein the first masking layer and the second masking layer comprises a thermal oxide material.

9. The method of claim 1 wherein the patterned silicon substrate comprises a waffle structure.

10. The method of claim 1 wherein the plurality of openings are provided in the first unprotected regions to the second unprotected regions.

* * * * *